US012753933B2

(12) United States Patent
Orlando

(10) Patent No.: US 12,753,933 B2
(45) Date of Patent: Oct. 6, 2026

(54) AUXILIARY SYSTEM FOR A LOW-TEMPERATURE THERMAL ENERGY DISTRIBUTION NETWORK

(71) Applicant: APTERIX SA, Lausanne (CH)

(72) Inventor: David Orlando, St-Légier (CH)

(73) Assignee: APTERIX SA, Lausanne (CH)

( * ) Notice: Subject to any disclaimer, the term of this patent is extended or adjusted under 35 U.S.C. 154(b) by 1191 days.

(21) Appl. No.: 17/641,234

(22) PCT Filed: Sep. 8, 2020

(86) PCT No.: PCT/EP2020/075108

§ 371 (c)(1), (2) Date: Mar. 8, 2022

(87) PCT Pub. No.: WO2021/048146

PCT Pub. Date: Mar. 18, 2021

(65) Prior Publication Data

US 2022/0325904 A1 Oct. 13, 2022

(30) Foreign Application Priority Data

Sep. 10, 2019 (EP) .................................... 19196455

(51) Int. Cl.
*F24D 19/10* (2006.01)
*H05K 7/20* (2006.01)

(52) U.S. Cl.
CPC ...... *F24D 19/1039* (2013.01); *F24D 2200/13* (2013.01); *G06F 2200/201* (2013.01); *H05K 7/20218* (2013.01); *H05K 7/20281* (2013.01)

(58) Field of Classification Search
CPC ............ F24D 19/1039; F24D 2220/13; H05K 7/20281; H05K 7/20218; G06F 2200/201
USPC ........................................... 62/115
See application file for complete search history.

(56) References Cited

U.S. PATENT DOCUMENTS

| | | | | |
|---|---|---|---|---|
| 10,036,272 | B2 * | 7/2018 | Somani | H02K 7/1823 |
| 2010/0307171 | A1 * | 12/2010 | Hamann | F25B 25/00 62/235.1 |
| 2018/0209675 | A1 * | 7/2018 | Ridder | F24F 3/001 |

FOREIGN PATENT DOCUMENTS

| | | |
|---|---|---|
| DE | 102009047908 | 8/2011 |
| GB | 2544063 | 5/2017 |
| WO | 2010/145040 | 12/2010 |

OTHER PUBLICATIONS

International Search Report and Written Opinion issued by the European Patent Office, dated Nov. 12, 2020, for International Patent Application No. PCT/EP2020/075108; 14 pages.

* cited by examiner

*Primary Examiner* — Joel M Attey
(74) *Attorney, Agent, or Firm* — Faegre Drinker Biddle & Reath LLP

(57) ABSTRACT

Auxiliary system for a low-temperature remote thermal energy distribution network (anergy network) connected to user thermal installations, comprising one or more heat pumps thermally coupled to the anergy network via a heat exchanger, one or more air-liquid heat exchangers thermally coupled to the outside air, and a hydraulic network interconnecting the heat pumps to the heat exchanger of the anergy network, at least one of the heat pumps being a liquid-air heat pump fluidically connected by the hydraulic network to at least one of said air-liquid heat exchangers. The auxiliary system further comprises a measurement, control and regulation (MCR) system. The hydraulic network comprises valves controlled by the MCR system and a hydraulic circuit configured to allow direct connection of said air-liquid heat exchangers to the heat exchanger of the anergy network.

10 Claims, 11 Drawing Sheets

| STATUS | | | | | | | | | | | | | | | | |
|---|---|---|---|---|---|---|---|---|---|---|---|---|---|---|---|---|
| PAC1 | PAC2 | PAC3 | Valve Pos.7a | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
| OFF | OFF | OFF | OFF | OFF | OFF | OFF | OFF | OFF | OFF | ON | ON | OFF | ON | ON | ON | OFF |

| STATUS | | | | | | | | | | | | | | | |
|---|---|---|---|---|---|---|---|---|---|---|---|---|---|---|---|
| PAC1 | PAC2 | PAC3 | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
| ON | OFF | OFF | ON | ON | OFF | OFF | OFF | OFF | OFF | OFF | OFF | ON | ON | ON | OFF |

STATUS

| PAC1 | PAC2 | PAC3 | Valve Pos.7a | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
|---|---|---|---|---|---|---|---|---|---|---|---|---|---|---|---|---|
| ON | ON | OFF | OFF | ON | ON | ON | ON | OFF | OFF | OFF | OFF | ON | ON | ON | ON | OFF |

| STATUS | | | | | | | | | | | | | | | | |
|---|---|---|---|---|---|---|---|---|---|---|---|---|---|---|---|---|
| PAC1 | PAC2 | PAC3 | Valve Pos.7a | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
| ON | ON | ON | OFF | ON | ON | ON | ON | ON | ON | OFF | OFF | OFF | ON | ON | ON | OFF |

| STATUS | | | | | | | | | | | | | | | |
|---|---|---|---|---|---|---|---|---|---|---|---|---|---|---|---|
| PAC1 | PAC2 | PAC3 | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
| ON | OFF | OFF | ON | ON | OFF | OFF | OFF | OFF | OFF | OFF | ON | ON | ON | ON | ON |

| PAC1 | PAC2 | PAC3 | Valve Pos.7a | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
|---|---|---|---|---|---|---|---|---|---|---|---|---|---|---|---|---|
| OFF | OFF | OFF | ON | OFF | OFF | OFF | OFF | OFF | OFF | ON | ON | ON | OFF | ON | ON | ON |

| STATUS | | | | | | | | | | | | | | | | | |
|---|---|---|---|---|---|---|---|---|---|---|---|---|---|---|---|---|---|
| PAC1 | PAC2 | PAC3 | Valve Pos.7a | Valve Pos.7b | Valve Pos.7c | Valve Pos.7d | Valve Pos.7e | Valve Pos.7f | Valve Pos.7g | Valve Pos.9a | Valve Pos.9b | Valve Pos.12 | Pump Pos.3 | Pump Pos.4 | Pump Pos.5 | Pump Pos.6 |
| ON | OFF | OFF | ON | OFF | OFF | OFF | OFF | OFF | OFF | OFF | OFF | ON | ON | ON | ON | ON |

AUXILIARY SYSTEM FOR A LOW-TEMPERATURE THERMAL ENERGY DISTRIBUTION NETWORK

CROSS-REFERENCE TO RELATED APPLICATIONS

The present application is a national stage entry of International (PCT) Patent Application Number PCT/EP2020/075108, filed Sep. 8, 2020, which claims priority to European Patent Application Number 19196455.0, filed Sep. 10, 2019, the complete disclosures of which are expressly incorporated herein by reference.

The present invention relates to a network for supplying and distributing thermal energy, in particular for supplying heat or cold to buildings, for example buildings in an urban district, connected to the network. The present invention relates more particularly to an auxiliary system for a low-temperature thermal energy distribution network.

There are remote thermal energy distribution networks (also called “CAD” remote heating networks) with local thermal energy networks, taking into account temperature differences as well as temperature variations and flow of possible heat transfer fluids between the various networks depending on the conditions, for example use, meteorological and geothermal conditions.

It is known to use a low-temperature remote thermal energy distribution network (known as the “Anergy network”) and heat pumps for users connected to this network for transfers of thermal energy between users and the Anergy network. An Anergy network typically comprises a tube in which circulates a heat transfer fluid connected to a plurality of energy consuming users (clients) and one or more energy producers. The reconciliation of low-temperature remote thermal energy distribution networks and heat pumps for users connected to this Anergy network with great resilience and maximum efficiency is difficult to achieve by existing systems. In existing systems, it is crucial to ensure that the average operating temperatures of the terrestrial dampers are positive in order to avoid the freezing of the basement, which would have consequences that can be very negative on the yield and the resilience of said thermal energy distribution network.

Several types of renewable energy thermal auxiliary systems are known for Anergy-type networks in order to increase the resilience and efficiency of the network, the most common being geothermal, solar, groundwater, rivers, lakes, wastewater or thermal discharges from industrial processes.

Geothermal auxiliary energy via the use of vertical type geothermal probes is particularly used with an Anergy network because the temperature gradient is very close. The advantage of this combination is to allow the seasonal surplus to be stored in the vertical probes and to recover this energy in winter. A disadvantage of this solution is the cost associated with said geothermal probes and the difficulties of cooling due to operating temperatures (typically more than 15 degrees) which are too high.

The thermal solar auxiliary energy is very interesting in terms of yields with an acceptable cost. The main disadvantage comes from the daily and seasonal variations in the energy available, and in particular the decrease in energy during the cold period when this auxiliary energy becomes very low.

Groundwater auxiliary energy is also interesting in terms of yields, but costs, authorizations as well as flowrate fluctuations are major constraints on the deployment of this solution. Auxiliary energy from rivers and lakes encounters the same difficulties as auxiliary energy from groundwater. Auxiliary energy by wastewater or thermal discharges encounters the same problems as those related to auxiliary energy by groundwater sources.

In cases where these various boosters are insufficient to heat said anergy network, the use of a boiler using primary energy, which is renewable or not, is possible. The disadvantage of such a solution is to reduce the possibility of directly heating the buildings which are connected to said anergy network, with this primary energy.

To get the best efficiency from a boiler, it is preferable to use a heat-power cogeneration system, also called combined heat-power (CHP), producing heat and electricity simultaneously. The electricity generated can be used locally to power supply buildings as well as heat pumps. The disadvantage of this solution is that it is impossible to use 100% of the heat and electricity part because of the variability of demand. Combined heat-power units allowing power variation reduce this disadvantage, without however eliminating it.

An object of the invention is to provide an auxiliary system for a low-temperature remote thermal energy distribution network (Anergy network) which overcomes the disadvantages of existing systems and which offers great resilience and high efficiency.

It is advantageous to provide an auxiliary system for an Anergy network that is economical to install.

It is advantageous to provide an auxiliary system for an Anergy network that is robust, reliable, and economical to maintain.

It is advantageous to provide an auxiliary system for an Anergy network that can be controlled easily and remotely.

Objects of the invention are achieved by an auxiliary system for a low-temperature remote thermal energy distribution network according to claim 1.

The dependent claims describe advantageous features of the invention.

This paper describes an auxiliary system for a low-temperature remote thermal energy distribution network (anergy network) connected to user thermal installations. The auxiliary system comprises one or more heat pumps thermally coupled to the anergy network via a heat exchanger, one or more air-liquid heat exchangers thermally coupled to the outside air, and a hydraulic network interconnecting the heat pumps to the heat exchanger of the anergy network. At least one of the heat pumps is a liquid-air heat pump fluidically connected by the hydraulic network to at least one of said air-liquid heat exchangers. The auxiliary system further comprises a measurement, control and regulation (MCR) system.

According to one aspect of the invention, the hydraulic network comprises valves controlled by the MCR system and a hydraulic circuit configured to allow direct connection of said air-liquid heat exchangers to the heat exchanger of the anergy network.

In an advantageous embodiment, the auxiliary system further comprises a system for the cogeneration of electrical and thermal energy, also called a combined heat-power system (CHP), thermally coupled to the hydraulic network via a heat exchanger.

In an advantageous embodiment, the hydraulic network comprises valves controlled by the MCR system and a hydraulic circuit configured to allow direct connection of the CHP system to the heat exchanger of the anergy network.

In an advantageous embodiment, the system further comprises a high-temperature thermal energy distribution network (HT network) thermally coupled to the hydraulic network via a heat exchanger.

In an advantageous embodiment, the hydraulic network comprises valves controlled by the MCR system and a hydraulic circuit configured to allow direct connection of the HT network to the heat exchanger of the anergy network.

In an advantageous embodiment, the auxiliary system comprises a plurality of said heat pumps.

In an advantageous embodiment, the heat pumps are fluidically interconnected to the hydraulic network in parallel, each heat pump being connected to the hydraulic network through valves controlled individually by the MCR system so as to allow the individual switching on of each heat pump independently of other heat pumps.

In an advantageous embodiment, the air-liquid heat exchangers comprise fans controlled by the MCR system.

In an advantageous embodiment, the auxiliary system comprises a plurality of said air-liquid heat exchangers.

In an advantageous embodiment, the air-liquid heat exchangers are fluidically interconnected to the hydraulic network in parallel.

In an advantageous embodiment, the MCR system comprises a plurality of temperature sensors, including at least one temperature sensor providing a temperature measurement of the heat transfer fluid in the anergy network and at least one temperature sensor providing a temperature measurement of the outside air.

This paper also describes a method for controlling an auxiliary system in which the heat pumps are switched on successively according to the heat requirement of the anergy network.

This paper also describes a method for controlling an auxiliary system in which, when heat energy is needed, the air-liquid heat exchangers are connected directly to the heat exchanger of the anergy network when the outside air temperature is above zero and above the measured temperature of the heat transfer fluid circulating in the anergy network Other purposes and advantageous aspects of the invention will appear upon reading the claims and/or the detailed description below of embodiments of the invention in relation to the figures, in which:

Figure 3A:
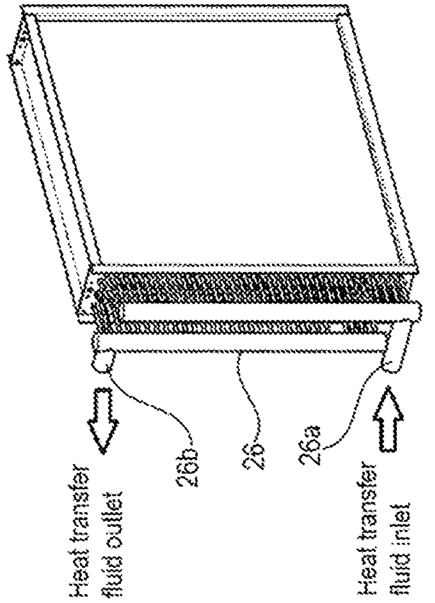
Figure 3B:
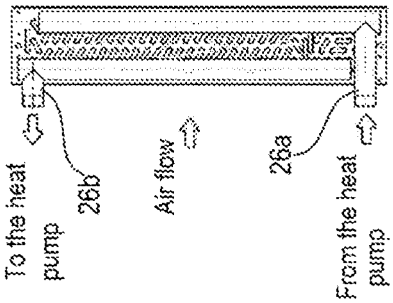
Figure 4A:
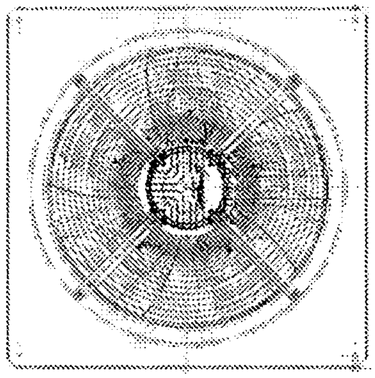
Figure 4B:
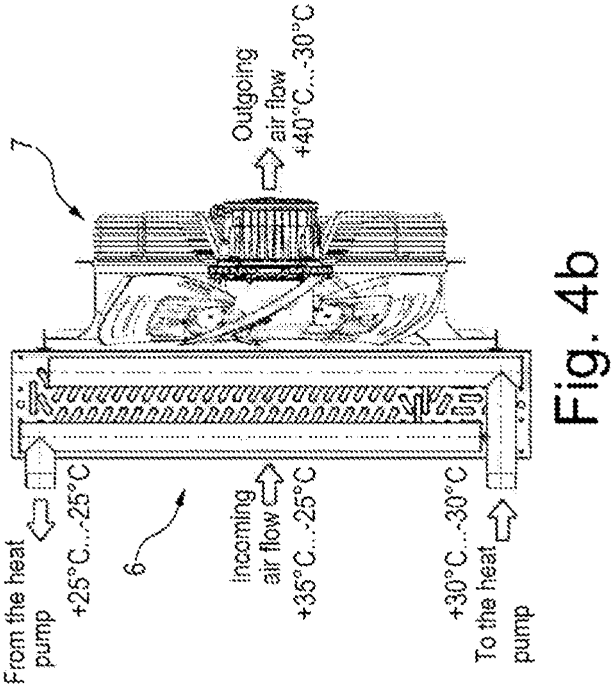
Figure 6A:
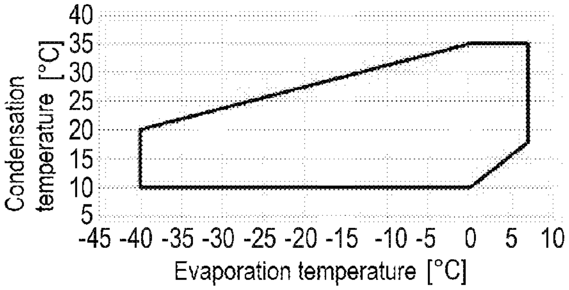
Figure 6B:
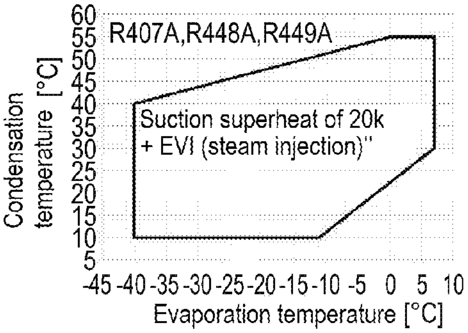
Figure 6C:
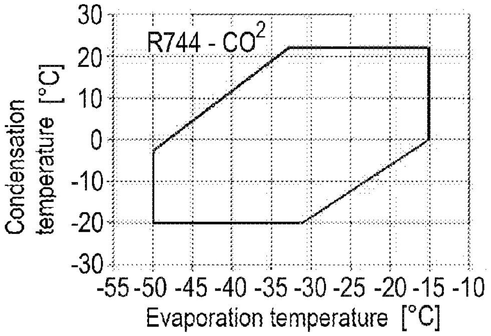
Figure 7A:
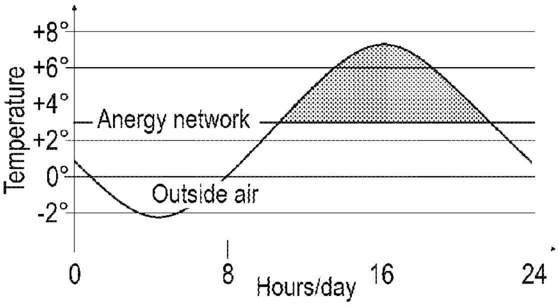
Figure 7B:
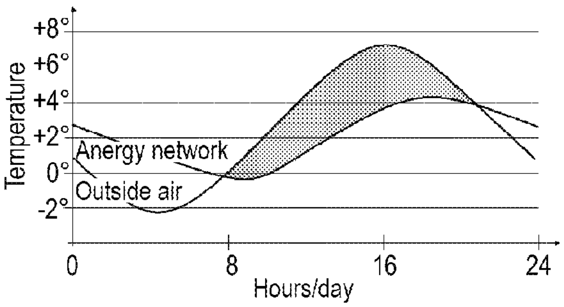
Figure 8:
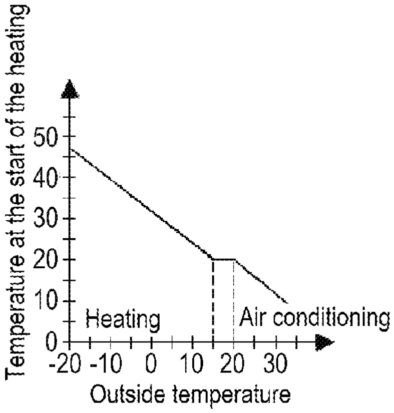

FIGS. 3*a* and 3*b* are perspective and side views of an air-liquid heat exchanger of the auxiliary system according to one embodiment of the invention;

FIGS. 4*a* and 4*b* are front and side views of an air-liquid heat exchanger with fan of the auxiliary system according to one embodiment of the invention;

FIGS. 5*a* to 5*g* are schematic views of a thermal energy distribution system according to one embodiment of the invention, illustrating different modes of operation;

FIGS. 6*a* to 6*c* are graphs of evaporation temperature as a function of condensation temperature of different heat transfer fluids for heat pumps;

FIGS. 7*a* and 7*b* illustrate examples of temperature variations in an anergy network and the outside air over the course of a day;

FIG. 8 illustrates a graph of heating temperature at the outlet of a typical heating installation as a function of the outside temperature.

Figure 1:
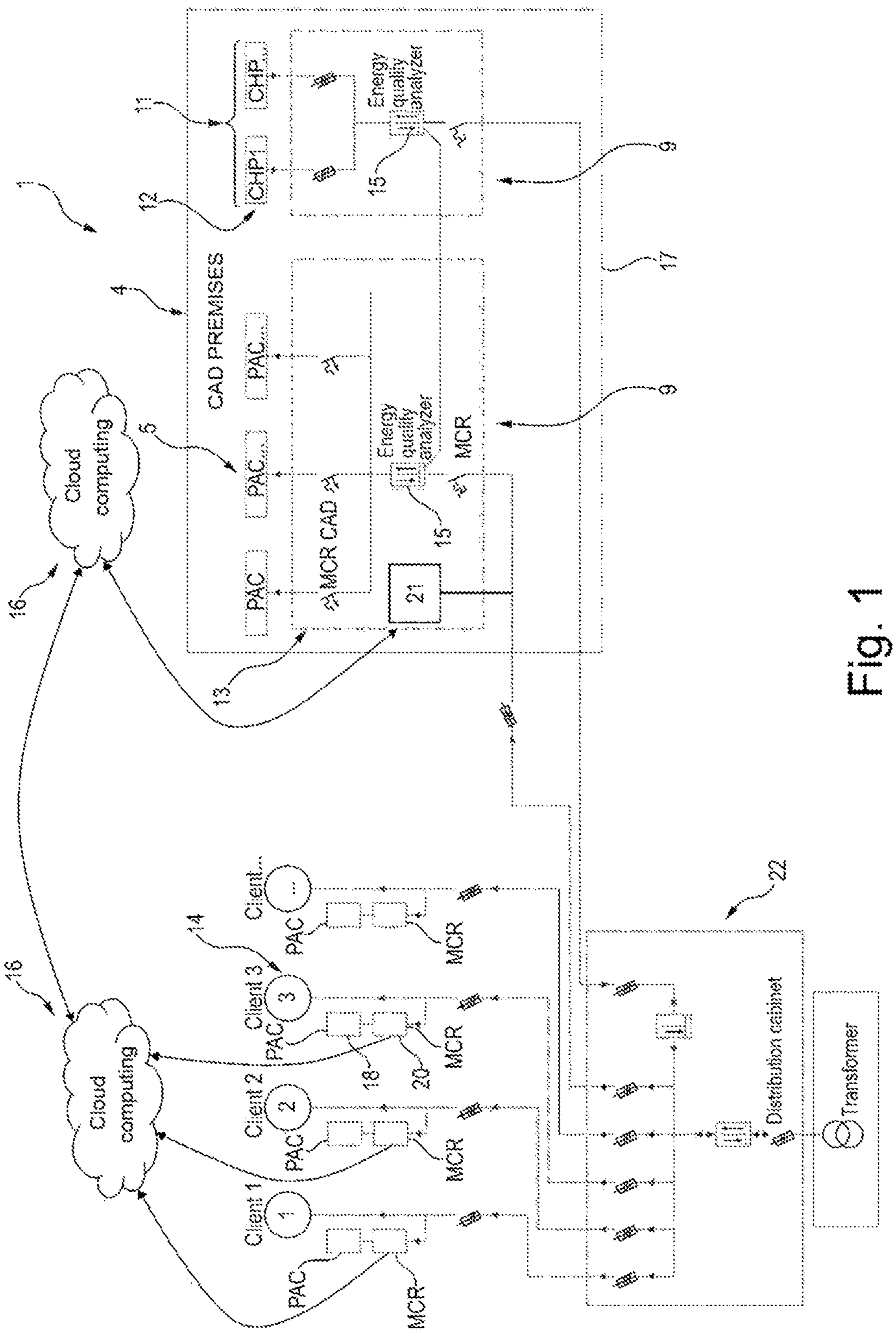
FIG. 1 is a schematic view of a thermal energy distribution system according to one embodiment of the invention.
Figure 2:
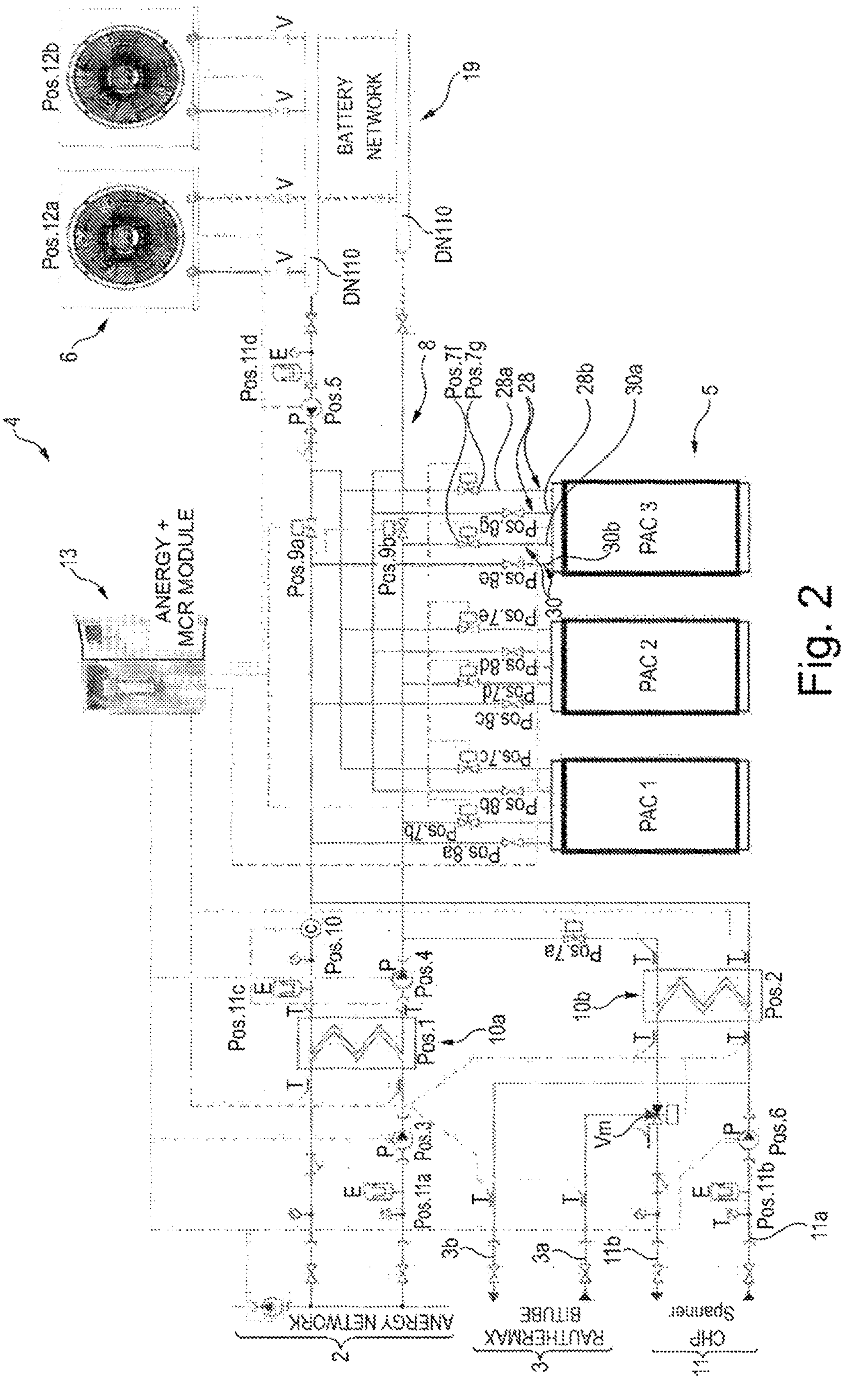
FIG. 2 is a schematic view of an auxiliary system of a low-temperature thermal energy distribution network according to one embodiment of the invention.

Referring to the figures, beginning with FIGS. 1 and 2, a thermal energy distribution system 1 comprises a low-temperature remote thermal energy distribution network 2, called an Anergy network, an auxiliary system for the anergy network 4 thermally connected to the Anergy network 2, and thermal installations for users (clients and thermal energy suppliers) 14 thermally connected to the Anergy network 2, in particular through heat exchangers (not shown).

The auxiliary system for the anergy network 4 can further be connected via a heat exchanger 10*b* to, and/or comprise, a system for the cogeneration of electrical and thermal energy, called a combined heat-power (CHP) system 11.

The auxiliary system for the anergy network 4 can further be connected via a heat exchanger 10*b* to, and/or comprise, a high-temperature (HT) thermal energy distribution network 3.

The thermal installations for users 14 who are consumers of thermal energy, typically in buildings (residential building, house, factory, shopping center, . . . ), typically comprise one or more hot water networks (not shown), one or more heat pumps 18, an MCR system 20 electrically connected, inter alia, to the heat pump, temperature sensors (not shown) and valves (not shown) for thermal regulation of the installation.

The auxiliary system 4 may further comprise power analyzers 15 of the various heat or cold generating units. The auxiliary system 4 may further comprise a communication module 21 for the electronic transmission and reception of data between the auxiliary system 4 and user installations, and/or servers, via a communication network 16 such as the internet. This data can be used for status checking, remote or centralized control and management of the thermal energy distribution system.

The Anergy network 2 comprises at least one tube in which a heat transfer fluid circulates between at least one heat emitter and a plurality of thermal energy consumers located at a distance from the emitter. The Anergy network 2 is typically an urban network interconnecting a plurality of buildings in a residential or industrial district, or in a mixed residential and industrial district. The Anergy network is largely buried and can use the ground to accumulate thermal energy, for example due to the production of solar heat in summer or for cooling buildings, or to release thermal energy, for example in winter for heating buildings or domestic water. Low-temperature remote thermal energy distribution networks 2 of this type are known per se and do not need to be described in detail herein.

The Anergy network 2 can advantageously be coupled to the auxiliary system for the anergy network 4 by a heat exchanger 10*a*, so that the heat transfer fluid from the Anergy network is independent of the heat transfer fluid circulating in the auxiliary system for the anergy network 4.

The heat transfer fluid circulating in the Anergy network 2 can typically be water or brine. The brine allows the Anergy network to circulate the heat transfer fluid at temperatures below 0° C.

The auxiliary system for the anergy network 4 comprises one or more heat pumps 5 one or more air-liquid heat exchangers 6 and a hydraulic network 8. The hydraulic network interconnects the heat pumps 5 to the Anergy network 2 via a heat exchanger 10*a*, to the HT 3 and CHP 11 networks via a heat exchanger 10*b*, as well as to the air-liquid heat exchangers 6. The auxiliary system for the Anergy network 4 further comprises a measurement, control and regulation system (MCR) 13.

As mentioned above, the cogeneration CHP system can be advantageously integrated into the auxiliary system for the anergy network 4, preferably installed in the same premise or building as other elements of the auxiliary system, in particular the heat pumps 5. The CHP system comprises a hydraulic CHP network 11 in which circulates a heat transfer fluid coupled through a heat exchanger to a CHP generator (not shown) producing heat and a mechanical force serving to drive an electric generator (not shown) for power generation. The CHP generator can in particular be a thermal combustion engine with an output shaft coupled to a rotating rotor of an electric generator. The CHP generator could also be in the form of a gas turbine or a steam turbine. Such generators CHP are known per se and do not need to be described in this application. Installing a CHP generator close to the other elements of the auxiliary system allows to reduce losses and to reduce the costs associated with the fluidic and electrical interconnection of the CHP system and the other elements of the auxiliary system.

At least one of the heat pumps 5 is a liquid-gas, in particular water-air heat pump, fluidically connected to at least one air-liquid heat exchanger 6, this is in particular a circuit on the evaporator side 28 of each heat pump which is fluidically connected to at least one air-liquid heat exchanger. If there are several heat pumps 5*a*, 5*b* . . . 5*n*, they can all be connected to air-liquid heat exchangers 6, or some can be connected to a geothermal probe or other heat sources near the location of the heat pump, such as waste heat sources from a factory. The air-liquid heat exchanger 6 is installed for an exchange with the environmental air, namely the outside air, to draw renewable energy from the environment.

The air-liquid heat exchanger 6 can have various configurations well known per se in the state of the art, comprising a heat transfer fluid circuit 26 with conduits (for example tubes) having an exchange surface exposed to an environmental air flow. A part of the circuit coupled to an inlet 26*a* of the circuit is preferably disposed downstream of the direction of the air flow with respect to a part of the circuit connected to an outlet 26*b* of the heat transfer fluid circuit 26. This "crossed" configuration allows to improve the heat exchange efficiency since the temperature gradient of the air flow in one axial direction through the heat exchanger decreases while in the opposite axial direction the temperature of the heat transfer fluid in the heat transfer fluid circuit 26 increases.

In a preferred embodiment, the air-liquid heat exchanger 6 preferably comprises a fan 7 which can be mounted on the body or the structure supporting the ducts (for example tubes) of the heat transfer fluid circuit 26, for an axial flow of air through the heat transfer fluid circuit.

In the context of the invention, however, it is possible to have an air flow by other means of forced convection, or by natural convection. In the latter case, the tubes will be placed in a place outside favoring a flow of air through the exchanger. In order to better control the heat exchange, however, it is preferable to have a fan for heat exchange by forced convection near the liquid circuit.

In the invention, it is preferable to have a plurality of heat exchangers, each comprising a heat transfer fluid circuit and a fan, in particular in a configuration where each heat exchanger 6 is coupled to a heat pump 5 in order to be able to start the heat pumps individually according to the heat requirement of the auxiliary system 4.

A plurality of air-liquid heat exchangers 6 can be fluidically interconnected by a hydraulic battery network 19, the circuits 26 being connected to the hydraulic battery through shut-off valves V.

The hydraulic network 8 interconnects the heat pumps 5 to the various elements of the auxiliary system comprising the air-liquid heat exchanger 6, the auxiliary system-Anergy network heat exchanger 10*a*, and the auxiliary system-HT/CHP network heat exchanger 10*b*. The hydraulic network comprises valves V1, V2, . . . Vn for controlling the flow of heat transfer liquid in the various sections of the hydraulic network 8, pumps P1, P2, . . . Pn for transporting the heat transfer fluid in various sections of the hydraulic network, and expansion vessels E1, E2, . . . En to compensate for the pressure variations in the hydraulic network.

The hydraulic network valves may comprise mixing valves and shut-off valves.

The valves and the pumps are arranged in the hydraulic network 8 so as to allow to hydraulically connect the heat pumps 5 individually with the liquid-liquid heat exchangers, in particular of the Anergy network 10*a*, and also to be able to hydraulically connect the heat air-liquid exchangers 6 with heat pumps 5, or directly with the auxiliary system-Anergy network heat exchanger 10*a*, depending on the outside air temperature and the heat requirements of the auxiliary system, which depends in particular on the temperature of the heat transfer circuit circulating in the Anergy network 2. The direct connection of the air-liquid heat exchangers 6 with the Anergy network 2 allows to optimize the coefficient of performance (COP) of the auxiliary system and consequently also of the thermal energy distribution system 1 as a whole.

The fact of being able to fluidically couple the air-liquid heat exchangers 6 directly to the Anergy network 2 when the temperature of the outside air is higher than the temperature of the Anergy network 2 as illustrated in the gray parts of FIGS. 7*a* and 7*b*, rather than coupling the air-water exchangers 6 to the heat pumps 5, allows to have optimum efficiency. Indeed, in conventional systems, use is made of air-water heat pumps, but the efficiency is lower than the direct coupling of air-water heat exchangers with the Anergy network when the outside air temperatures are higher than the temperatures of the Anergy network.

Heat pumps are necessary in order to transfer heat to the Anergy network when the temperature of the outside air is less than the temperature of the Anergy network, but being able to decouple the air-liquid exchangers 6 from the corresponding heat pumps 5 for a direct hydraulic connection with the heat exchanger 10*a* coupled to the Anergy network 2, the efficiency is increased due to the fact that there is only the electrical consumption of the fans (if there are any), without the electrical consumption of the compressors of the heat pumps 5. Also, the fact that the air-liquid heat exchangers 6, when there is a plurality, are decoupled from the heat pumps 5, allows to use them in parallel to selectively supply a heat pump or several heat pumps, or directly the Anergy network, with maximum flexibility allowing to optimize the COP.

The heat pumps 5 each comprise an evaporator side hydraulic circuit part 28 and a condenser side hydraulic circuit part 30. The evaporator side hydraulic circuit part is thermally coupled to a low pressure part (evaporator) of the heat pump and the part of the hydraulic circuit on the condenser side is thermally coupled to a high pressure part (condenser) of the heat pump. As well known in heat pumps, the low pressure part is the cold part of the heat pump which receives thermal energy from the hydraulic circuit on the evaporator side and the high pressure part is the hot part of the heat pump which supplies thermal energy to the hydraulic circuit on the condenser side. For simplicity the evaporator side hydraulic circuit part will be called "evaporator side circuit" and the condenser side hydraulic circuit part will be called the "condenser side circuit".

The circuit on the condenser side comprises an inlet 30*a* and an outlet 30*b*, connected to the Anergy network 2 via heat exchanger 10*a*, as well as to the HT network 3 and to the CHP network 11.

The evaporator side circuit 28 comprises an inlet 28*a* and an outlet 28*b*, connected to the hydraulic network 8.

The heat transfer fluid circulating in the heat exchanger 10*a* on the side of the auxiliary system 4, and which also circulates in the circuit on the condenser side 30 of the heat pump 5 and in the HT 3 and/or CHP 11 network, must be able to withstand temperatures below 0° C. and above the temperature of the HT 3 and/or CHP 11 network, in particular within a range of temperatures typically ranging from −20° C. to 90° C. This fluid can for example be glycol water, well known in thermal systems.

The high-temperature thermal energy distribution network 3 comprises at least two tubes 3*a*, 3*b* in which circulates, in a closed circuit, a heat transfer fluid between the heat exchanger 10*b* and a high-temperature (HT) heat source, such as a photovoltaic, solar, or fuel-based thermal generator. The heat source HT can be a local heat source, namely a source of energy generated in the building in which the heat pumps 5 of the auxiliary system 4 are located, or a remote heat source, for example resulting from an industrial operation, such as a materials processing plant, or a power plant. In the latter case, the closed circuit of the HT network connected to the auxiliary system 4 can be coupled to the heat source produced remotely by a heat exchanger near the heat source, so that a part of the closed circuit of the HT network 3 is disposed locally (in the auxiliary system 4).

The CHP distribution network 11 comprises at least two tubes 11*a*, 11*b* in which circulates, in a closed circuit, a heat transfer fluid between the heat exchanger 10*b* and a CHP generator, such as a heat engine (for example a combustion engine). The CHP generator is preferably installed locally, namely close to the heat pumps 5, for example in the same premise or building.

The heat exchanger 10*b* of the CHP network 11 and/or of the HT network 3 can be connected by valves of the hydraulic network 8 either to one or more heat pumps 5, in particular to the circuit(s) on the condenser side of said heat pump(s), either directly to the heat exchanger 10*a* of the Anergy network in order to be able to have a heat exchange directly between the HT network 3 and/or the CHP network 11 with the Anergy network according to the requirements while optimizing the COP of the thermal energy distribution system 1.

The fluid inlet tube 3*a* of the HT network 3 can advantageously be fluidically connected through a mixing valve Vm to the outlet tube 11*b* of the CHP network in order to use the CHP generator (not shown) to increase the temperature of the heat transfer fluid from the HT network. Since the temperature of the heat exchanger on the side of the CHP generator is generally higher than the temperature of the HT network, there is an advantage for improving the overall COP of circulating the heat transfer fluid from the HT network in series through the CHP network when the latter is in operation, rather than mixing the heat transfer fluids passing through the heat exchanger 10*b* or individually connecting the HT 3 and CHP 11 networks via separate heat exchangers to the hydraulic network 8 of the auxiliary system 4. Moreover, this allows to reduce equipment (in particular the number of heat exchangers) to save space and reduce maintenance and installation costs.

The MCR system 13 is preferably installed in the building in which the heat pumps 5 of the auxiliary system 4 are installed, and is connected to various temperature sensors T (including an outdoor sensor), pumps P, valves V, and drive units (motors) of the compressors of the heat pumps 5 and of the fans 6, for regulating the temperature and the flow of heat transfer fluid in the hydraulic network 8 according to requirements.

The auxiliary system according to the invention therefore has a modular configuration that can be adapted according to the requirements, for example it is possible to connect several heat pumps 5 in parallel, and in this case shut-off valves controlled by the MCR module 13 allow to hydraulically isolate the units which are not in operation. In this way, maximum efficiency is preserved.

In an example of a practical installation for a residential district of a few hundred inhabitants, the dimensioning of an air-liquid heat exchanger 6 will have, for example, a maximum air flowrate of 5000 m3/h with an air temperature differential of 4° and a heat transfer fluid temperature differential of 3° C. and a pressure drop of a maximum value of 30 kPa. The overall thermal sizing of the air-water exchangers must satisfy the maximum cooling capacity reached when heating requirements are greatest. The hydraulic connection on the air-liquid heat exchangers 6 of the counter-current type as mentioned above, allows to reach a temperature of the heat transfer fluid at the outlet of the exchanger as close as possible to the temperature of the air flow entering said heat exchanger.

The choice of cooling fluid for heat pumps 5 must be made for the lowest possible GWP (Global Warming Potential) factor with the operating envelope in line with the minimum temperature of the outside air of the geographical location of installation of the anergy network 2 and with a reference temperature of the network which corresponds to the average temperature of the location at the depth in the ground of the tube of the anergy network 2, for example at a depth of 1.5 meters.

The minimum evaporation temperature will be equal to the minimum operating temperature of the cold part of the hydraulic battery 19 and at this operating point the condensation temperature will be equal or slightly higher. The maximum evaporation temperature will be equal to or higher than 0° C. with the lowest possible condensation temperature. The ideal compressor envelope should match the operating envelope in FIG. 6*a*. However, cooling fluids that can operate with an evaporation temperature of 0° C. with a condensation temperature of 10° C. are not common and to overcome this problem it is possible to use compressors for refrigeration allowing an operating range capable of heating the anergy network with good efficiency. For example, an advantageous refrigerant to be used is the R449 type, with a GWP of 1300 and an ODP (Ozone Depletion Potential) of 0 (FIG. 6*b*).

In the future, a natural cooling fluid of the C02 type could be considered because it ideally has a GWP of 0 and an ODP (Ozone Depletion Potential) of 0. Its critical temperature being 31° C., therefore much higher than the desired 10° C. Operation in subcritical mode is well adapted. FIG. 6*c* illustrates the operating envelope for this type of refrigerant.

The heat transfer fluids in the different parts of the system separated by heat exchangers can have different compositions, typically antifreeze mixtures, optimized for the operating temperature range in the concerned part and viscosity properties. In the hydraulic circuit of heat pumps and cold hydraulic batteries 19, the mixture can for example be mainly of the ethylene-glycol type with antifreeze protection greater than the lowest outside temperature reached in the geographical location of the installation. The choice of this mixture is mainly dictated by the desire to obtain good fluidity at a very low temperature. For example, minimum temperatures can be −30° C. in mountain regions, −25° C. in plain regions, and −20° C. in cities. This differentiation is very important to increase the overall efficiency of the installation according to the average annual operating temperature.

In the CHP circuit, the heat transfer fluid can also comprise an antifreeze mixture, for example composed of propylene glycol which is non-toxic for a protection at −5° C. in all cases.

In the anergy network circuit, the heat transfer fluid can be water with a propylene glycol mixture with protection at −5° C., or brine.

The heat exchanger 10*a* between the anergy network and the heat pumps 5 may comprise plates with a dimensioning allowing to obtain high transfer powers with a low temperature differential of 3-5° C.

The selection valves of the various heat pumps 5 must be able to operate with the minimum temperature of the installation which is for example between −30° C. and −20° C. For very cold areas the valves can have a heated drive shaft and be made of a cold resistant material such as ABS (Acrylnitril-Butadien-Styrol).

The system comprises several operating modes depending on the needs, the control and regulation of the elements being carried out by the MCR electronic management module 13.

The priority of the MCR module 13 is to ensure that the temperature of the heat transfer fluid circulating in the anergy network 2 is at an adequate temperature for the correct operation of the heat pumps of the users 14 which are connected to the anergy network 2. The return temperature of the anergy network 2 must be maintained at a temperature above 0° C. to prevent freezing of the ground surrounding the anergy network tube. In some cases, the heat transfer fluid can drop to a temperature below 0° C. for a short period of time, for example a few hours.

Depending on the temperature of the anergy network 2, the MCR module 13 varies the power produced by the heat pumps 5 of the auxiliary system. The average return temperature of the anergy network 2 will always be maintained above 0° C. A first temperature sensor T1 in the anergy network 2, at the inlet of the heat exchanger 10*a* is connected to the MCR module 13 and gives information on the temperature of the anergy network 2. This first temperature sensor gives the setpoint so that the MCR module 13 engages, triggers and regulates the various elements (valves, pumps, fans) to seek to obtain the best possible efficiency according to the temperature of the Anergy network 2 and the temperature of the outside air. A second temperature sensor T2 connected to the MCR module 13 can be mounted in the anergy network 2 at the outlet of the heat exchanger 10*a*.

Figure 5A:
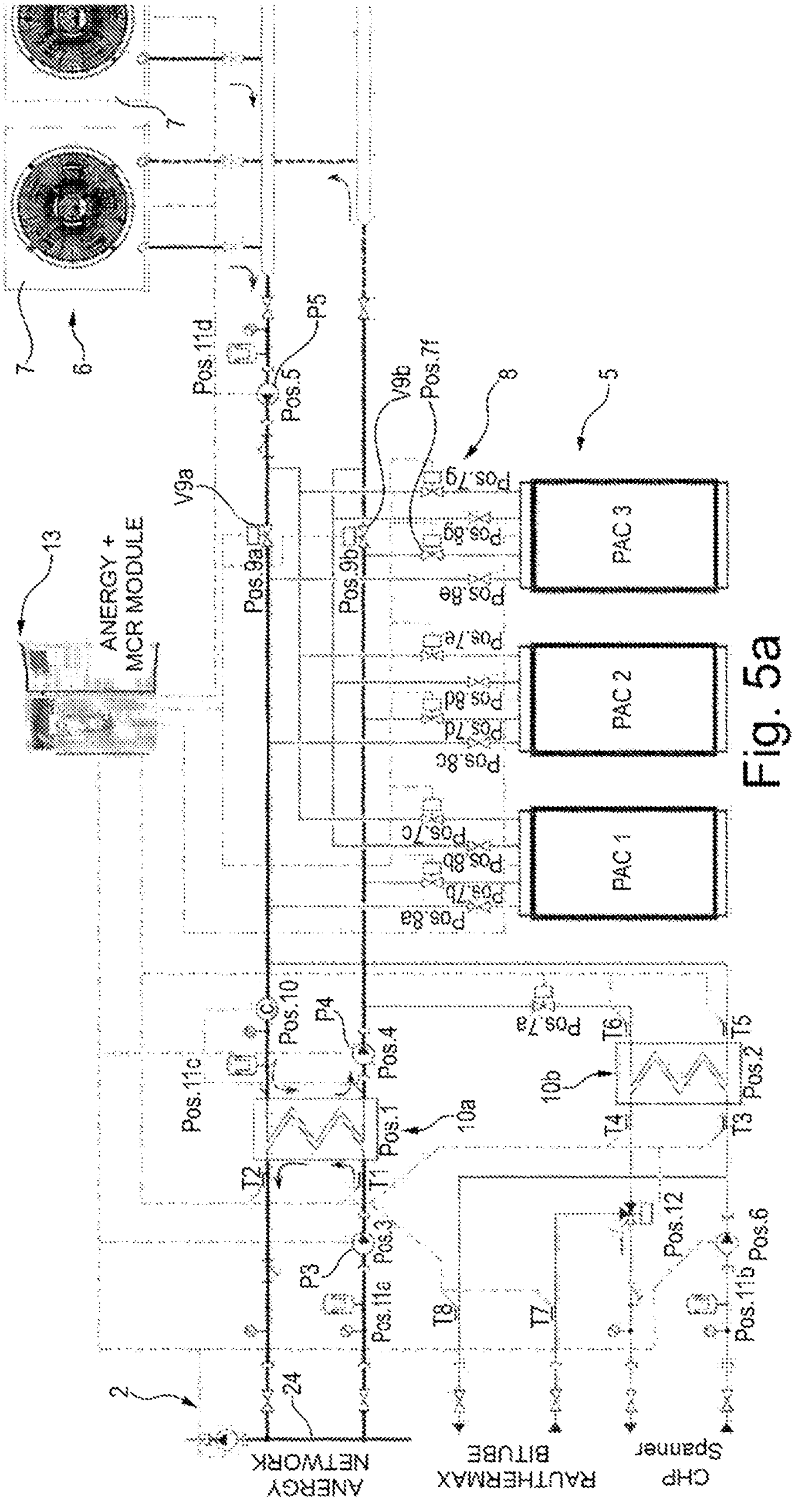

In a first exemplary operating scenario illustrated in FIG. 5*a*, the temperature of the outside air, measured by a temperature sensor (not shown) connected to the MCR 13, is higher than the temperature measured by the temperature sensor T2 of the heat transfer fluid which circulates in the tube of the anergy network 2. This corresponds to the gray areas indicated in FIGS. 7*a*, 7*b* illustrating examples of temperature measurements of the anergy network and of the outside air over one day. The MCR module 13 controls the opening of the two-way valves V9*a* and V9*b* and actuates circulation pumps P4, P5 in the hydraulic network 8 of the auxiliary system 4. The MCR module also controls the actuation of the fans 7 of the air-liquid heat exchangers 6. The MCR module 13 also controls the actuation of a pump P3 coupled to the anergy network 2 causing the heat transfer fluid of the anergy network to circulate in the heat exchanger 10*a* at the interface with the hydraulic network 8 of the auxiliary system. As the temperature of the anergy network heat transfer fluid 2 is colder than the temperature of the outside air, the latter will heat the anergy network fluid through the anergy network auxiliary system heat exchanger 10*a*. The MCR system 9 may comprise a heat energy meter C10 in the hydraulic network 8 of the auxiliary system, in particular at the inlet of the heat exchanger 10*a*, which allows to measure the amount of thermal energy transiting in the network. The MCR module 13 via this energy measurement can regulate the speed of the pumps P4, P5 and the rotation speed of the fans 7 of the air-liquid exchangers 6 to obtain the best possible efficiency by measuring the electrical consumption. The purpose is to transfer thermal energy with the lowest costs. The heat pumps 5 can advantageously be stopped provided that the return temperature of the anergy network measured by the temperature sensor T2 is greater than 0° C.

When the return temperature of the heat transfer fluid circulating in the anergy network 2 measured by the temperature sensor T2 is below or close to 0° C. and the operating mode described in the first example, that is to say only by using the air-liquid heat exchangers 6 directly coupled to the heat exchanger 10*a* between the auxiliary system and the anergy network 2, is insufficient to contain the drop in temperature of the heat transfer fluid, the MCR module 13 controls an energy input from other energy sources of the auxiliary system. These other energy sources may comprise one or more of the heat pumps 5, the HT network 3, and/or the CHP system 11.

In a second example, when the return temperature of the heat transfer fluid circulating in the anergy network 2 is below or close to 0° C. and the mode of operation directly using the air-liquid heat exchangers 6 is insufficient, the MCR system controls the switching on of one or more of the heat pumps 5 according to the energy requirement. Preferably, the heat pumps are switched on gradually and successively according to the energy requirement, and consequently the number of heat pumps switched on will depend on the energy demand. For a given demand, the use of some of the heat pumps is more efficient than operating all the heat pumps simultaneously but at a lower speed.

Figure 5B:
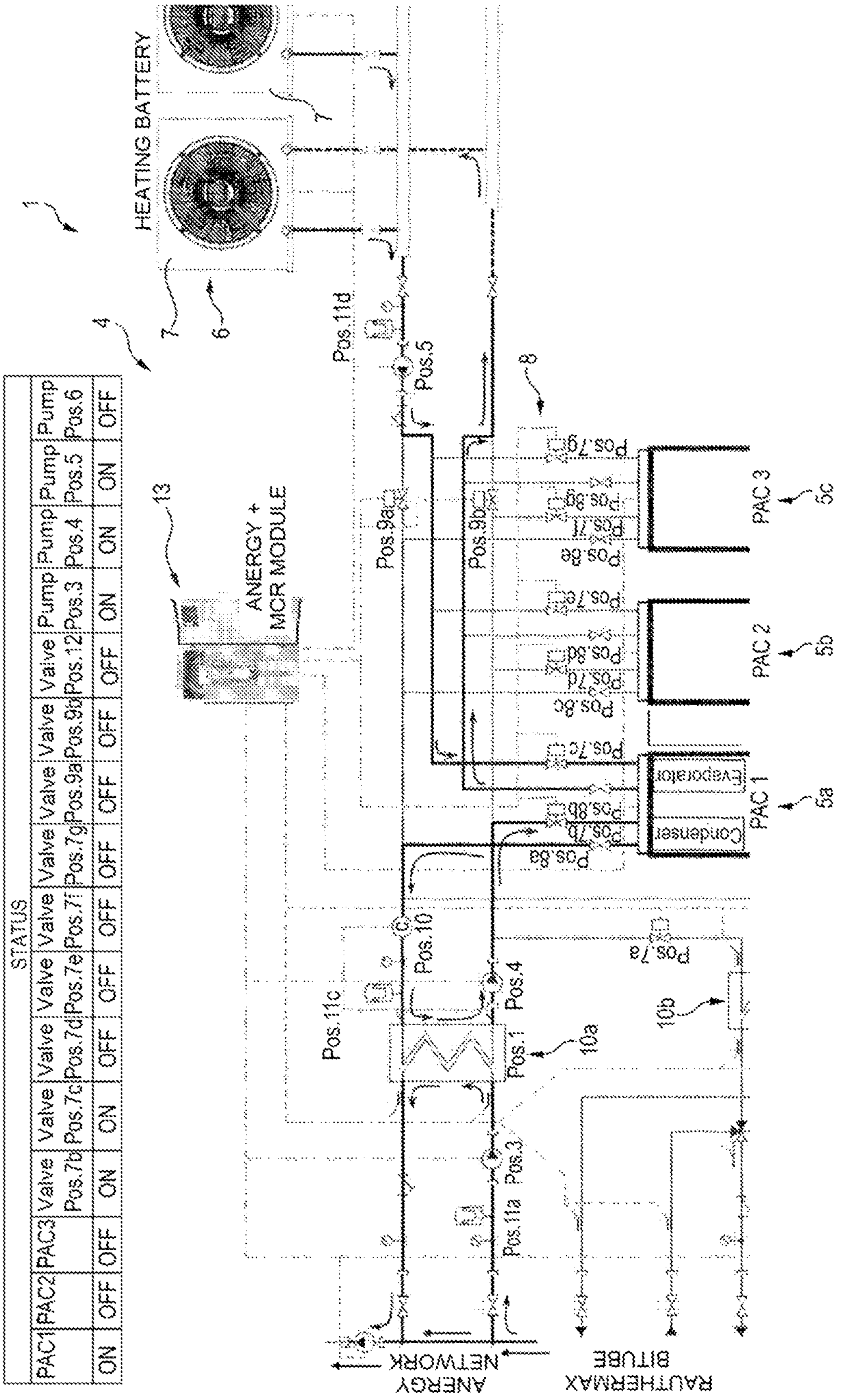
Figure 5C:
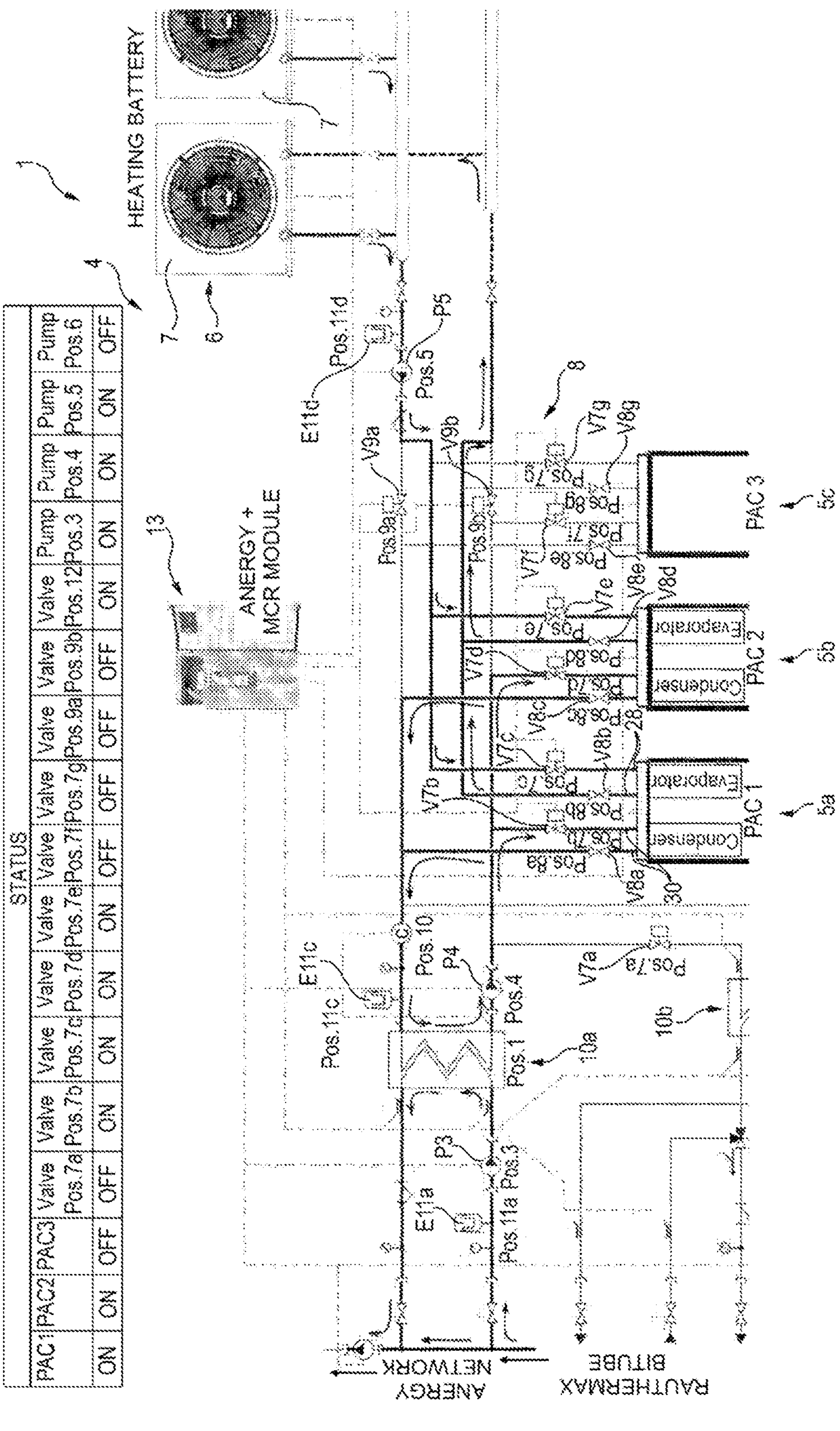
Figure 5D:
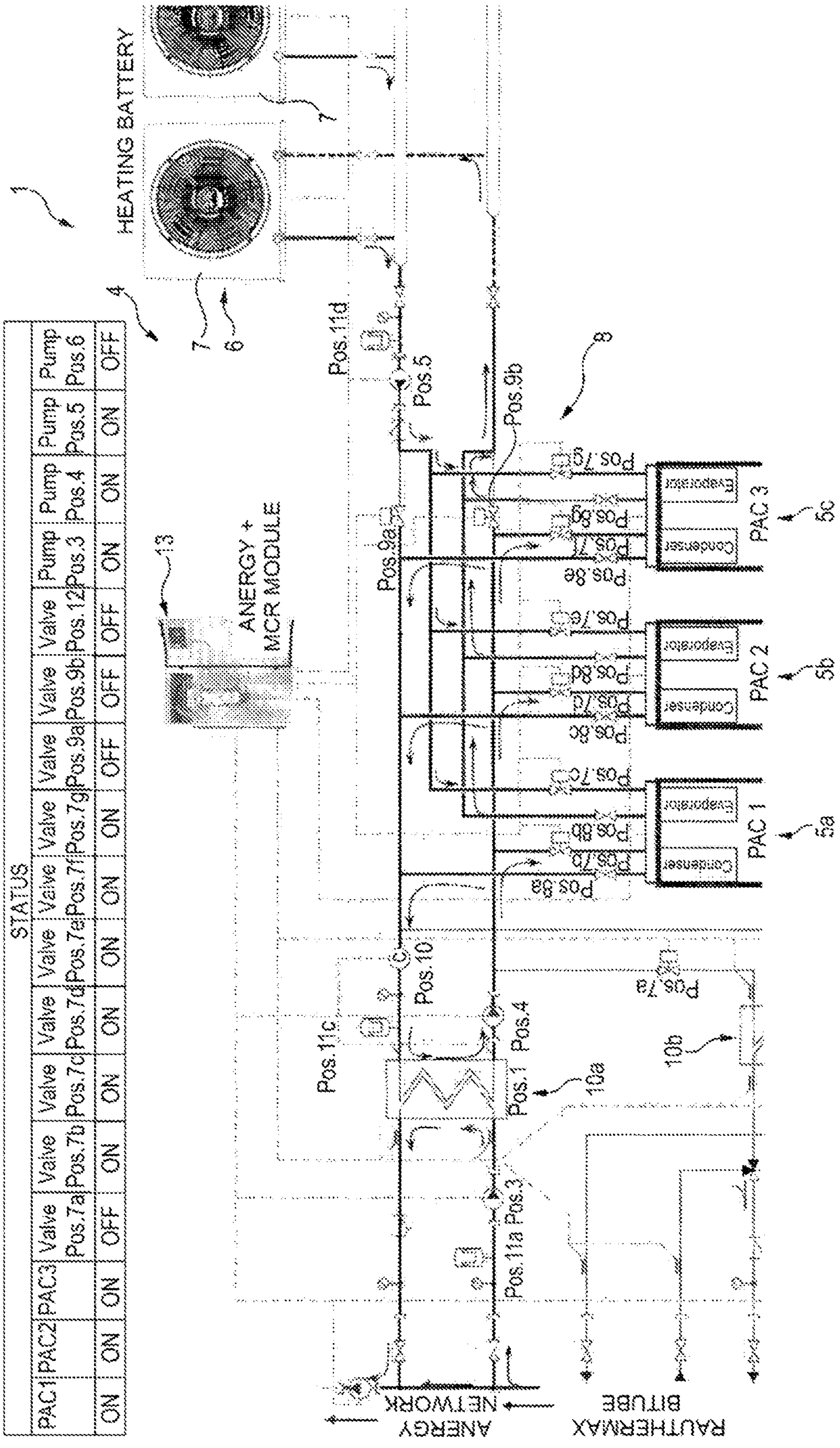
Figure 5E:
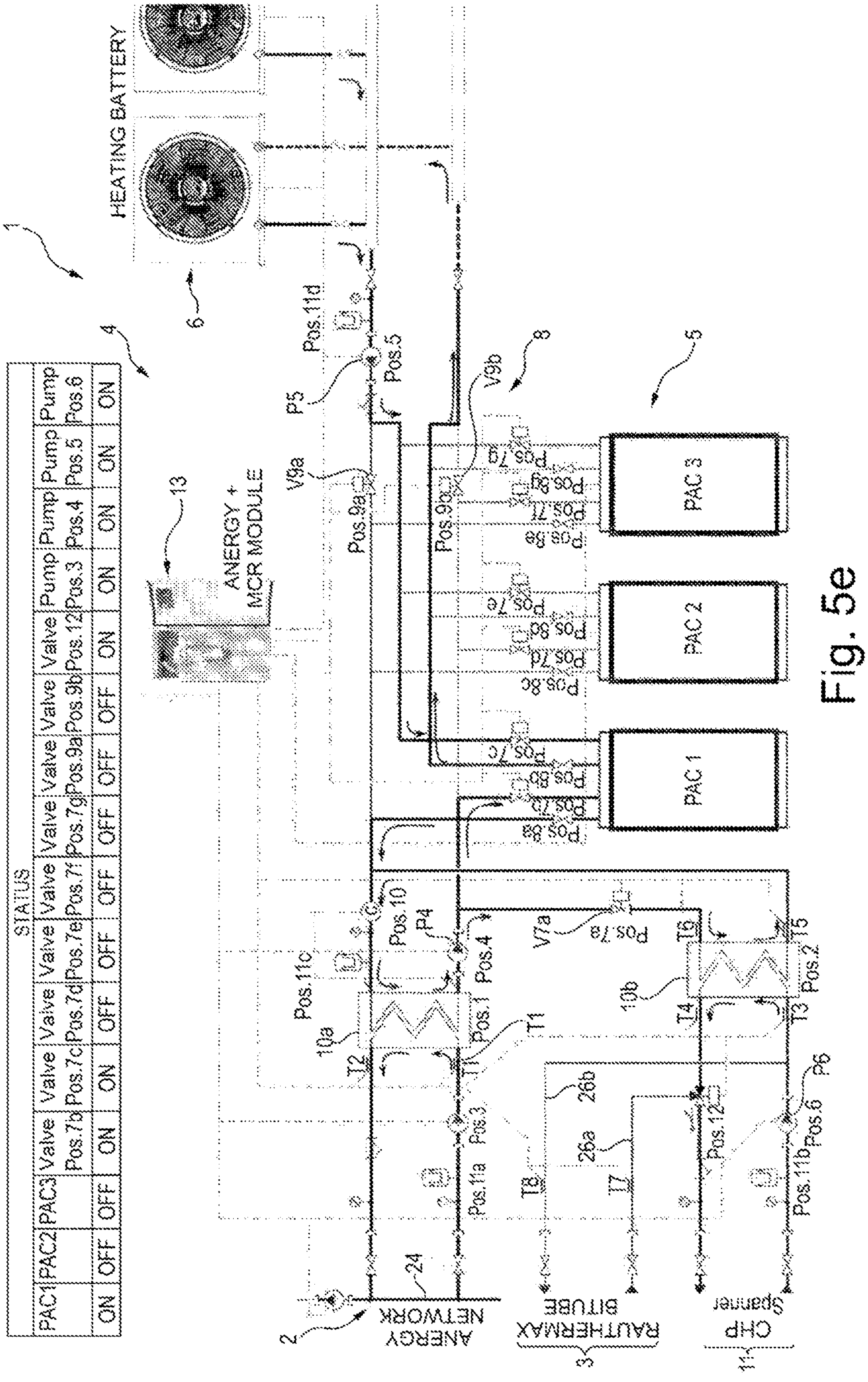

The heat pumps are hydraulically connected in parallel, and by acting on the various valves V7*b* to V7*g*, V8*a* to V8*g*, the opening and closing of the condenser 30 and evaporator 28 circuits of each heat pump 5 can be controlled by the MCR system 13 to connect the heat pumps 5 to the hydraulic network 8 of the auxiliary system 4. In the event of an energy need, initially, a first heat pump 5*a* is switched on as illustrated in FIG. 5*b* and the heat produced is transferred to the anergy network 2 the heat exchanger 10*a*. The MCR module 13 receiving a measurement of the temperature of the anergy network 2 by the temperature sensor T1 can perform a calculation in order to simulate the short-term temperature variation (for example 1 to 15 minutes). If the simulation indicates that the temperature continues to drop, a second heat pump 5*b* can be switched on in parallel as shown in FIG. 5*c*. The second heat pump 5*b* can have the same power as the first heat pump 5*a*. If the temperature trend of the anergy network 2 is still downward, a third heat pump 5*b* can be switched on in parallel as shown in FIG. 5*d*.

In the context of the invention, the auxiliary system 4 may have only one heat pump, or only two heat pumps, or more than three heat pumps, depending on the energy needs to be provided, which depend among others, on the geographical location and the number of users.

When all the heat pumps 5 are used, if the temperature of the anergy network is still falling, the MCR module 13 can control an increase in the thermal power of the heat pumps 5 if they are not operating at their maximum power. The circulation pumps P4, P5 and the speed of the fans 7 can be selected to obtain a fixed temperature differential, for example of approximately 3° C., between inlets and outlets of the condensers 30, and/or between inlets and outlets of the evaporators 28, and/or between inlets and outlets 26*a*, 26*b* of the air-liquid heat exchangers 6.

The power modulation of the heat pumps 5 can be selected to increase the temperature of the heat transfer fluid of the anergy network 2 to a setpoint temperature of approximately 4° C. to 6° C., for example 5° C. This temperature advantageously allows to limit the transfer of energy to the ground which envelops the tube (conduit) of the anergy network 2.

If the temperature of the heat transfer fluid of the anergy network is increasing and exceeds a threshold value, for example the setpoint value or the setpoint value plus a margin, for example 1° C. more than the setpoint value, the MCR 13 controls a decrease in the power of the heat pumps 5. The decrease in power can be carried out in the reverse order of the increase in power described above, by reducing the number of operating heat pumps.

The possibility of starting the heat pumps successively in parallel or of decoupling them leaving the air-water heat exchangers to directly heat the anergy network through the heat exchanger 10*b* allows to optimize the average COP of the entire auxiliary system 4 taking into account the consumption of all the pumps and compressors necessary for the operation of the heat pumps and the circulation of heat transfer fluid in the hydraulic network and the air-liquid heat exchangers of the auxiliary system.

When the heat supply to the anergy network 2 by all the heat pumps 5 associated with the air-water heat exchangers 6 is insufficient, calorific energy can be supplied by the CHP network 11 of a CHP system (combined heat-power). Caloric energy can also be provided by the HT network 3. The CHP system 11 can be activated if the heat pumps and the HT network 3 (if available) are not sufficient to reach the desired temperature of the Anergy network 2.

Moreover, when the temperature of the outside air is very low, the electricity consumption of the heat pumps 5 becomes greater and the use of a thermal auxiliary energy such as a combined heat-power system can optimize the overall COP.

The heat from the CHP network 11 is transferred via the heat exchanger 10*b* to the hydraulic network 8 by opening the valve V7*a* and then to the anergy network 2 by the heat exchanger 10*a*.

The MCR module 13 controls the adjustment of the speed of the circulation pump P4 to ensure a desired temperature differential, for example from 2 to 4° C., for example 3° C., on the condenser 30 of the heat pump 5 or the heat pumps 5. The pump P6 of the hydraulic circuit of the CHP network 11 is also adjusted to guarantee the transfer of energy through the heat exchanger 10*b* according to the temperature of the heat transfer fluid of the CHP network 11. Depending on the needs and the energy input of the CHP system, the number of heat pumps 5 switched on can be adjusted from zero to all.

The electrical part produced by the CHP generator can be partly used directly by the heat pump(s) 5 which are switched on. All the accessories that make up the auxiliary system can also use the electrical energy generated. The balance of electricity production can be distributed to the electrical installations of the users 14 of the anergy network 2, which can be connected by a distribution cabinet 22 to the same supply transformer as illustrated in FIG. 1.

Since the MCR module of the CAD is connected to the electrical analyzer which power supplies the CHP group, it is perfectly possible to multiply the number of heat coupling units as well as the number of heat pumps that can self-consume the electricity produced by all the CHP units.

When the temperature of the outside air is less than 3-4 degrees, the temperature of the heat transfer fluid circulating in the air-liquid heat exchangers 6 will be less than −1° C. and in this case the humidity contained in the outside air will condense on the outer surface (for example fins) of the heat exchanger and as the surface temperature is below 0° C., this condensed water will freeze. The formation of frost reduces the efficiency of heat exchange. In a third example, to eliminate a layer of frost on the air-liquid heat exchangers 6, in an advantageous embodiment, the anergy network which is at a temperature above 0° C. can be coupled to the heat transfer fluid of the hydraulic network 8 as illustrated in FIG. 5*a* (but in this case the fans are not running), to heat the heat transfer fluid of the part of the circuit which supplies the air-liquid exchangers 6.

Figure 5F:
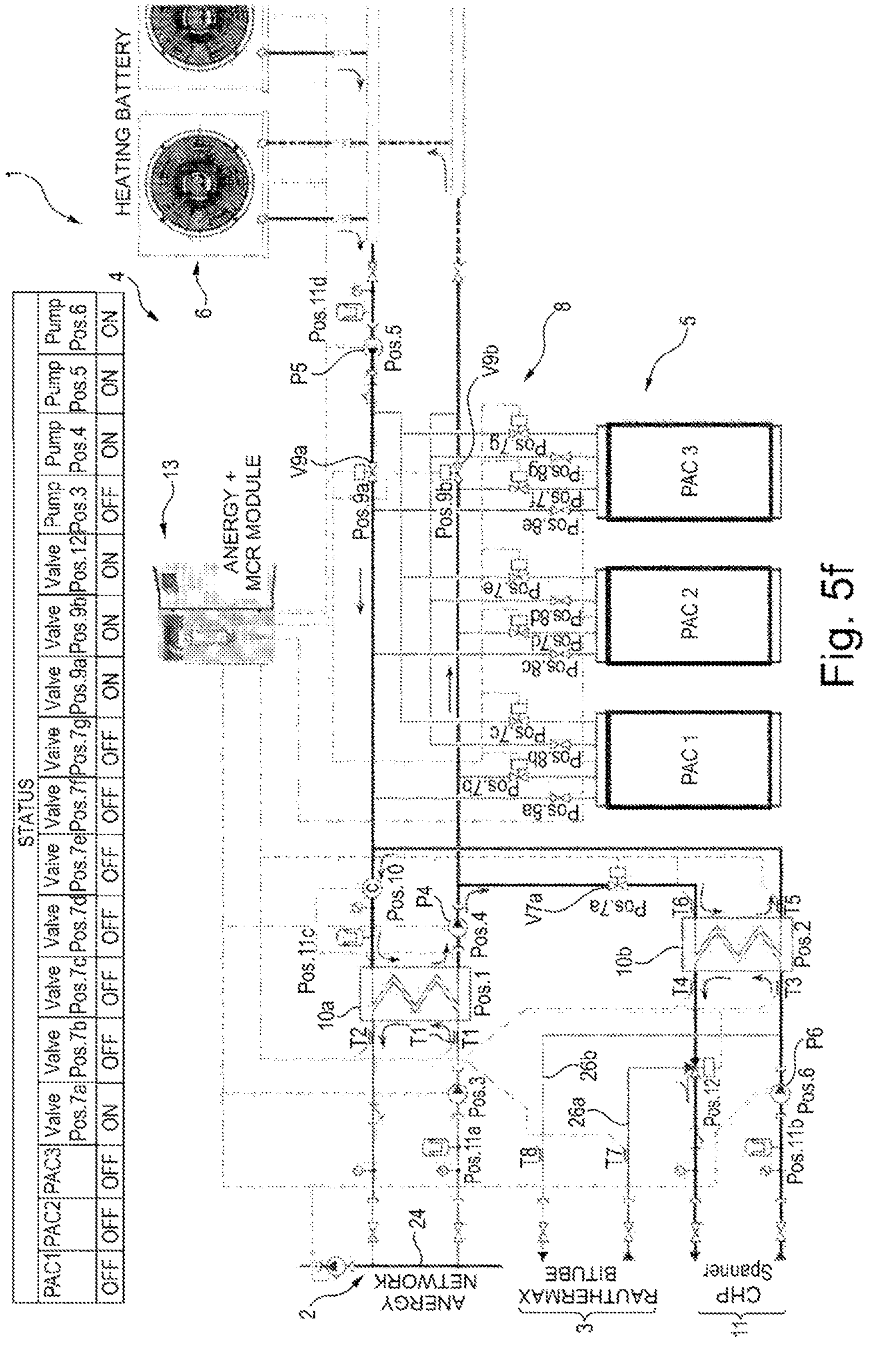
Figure 5G:
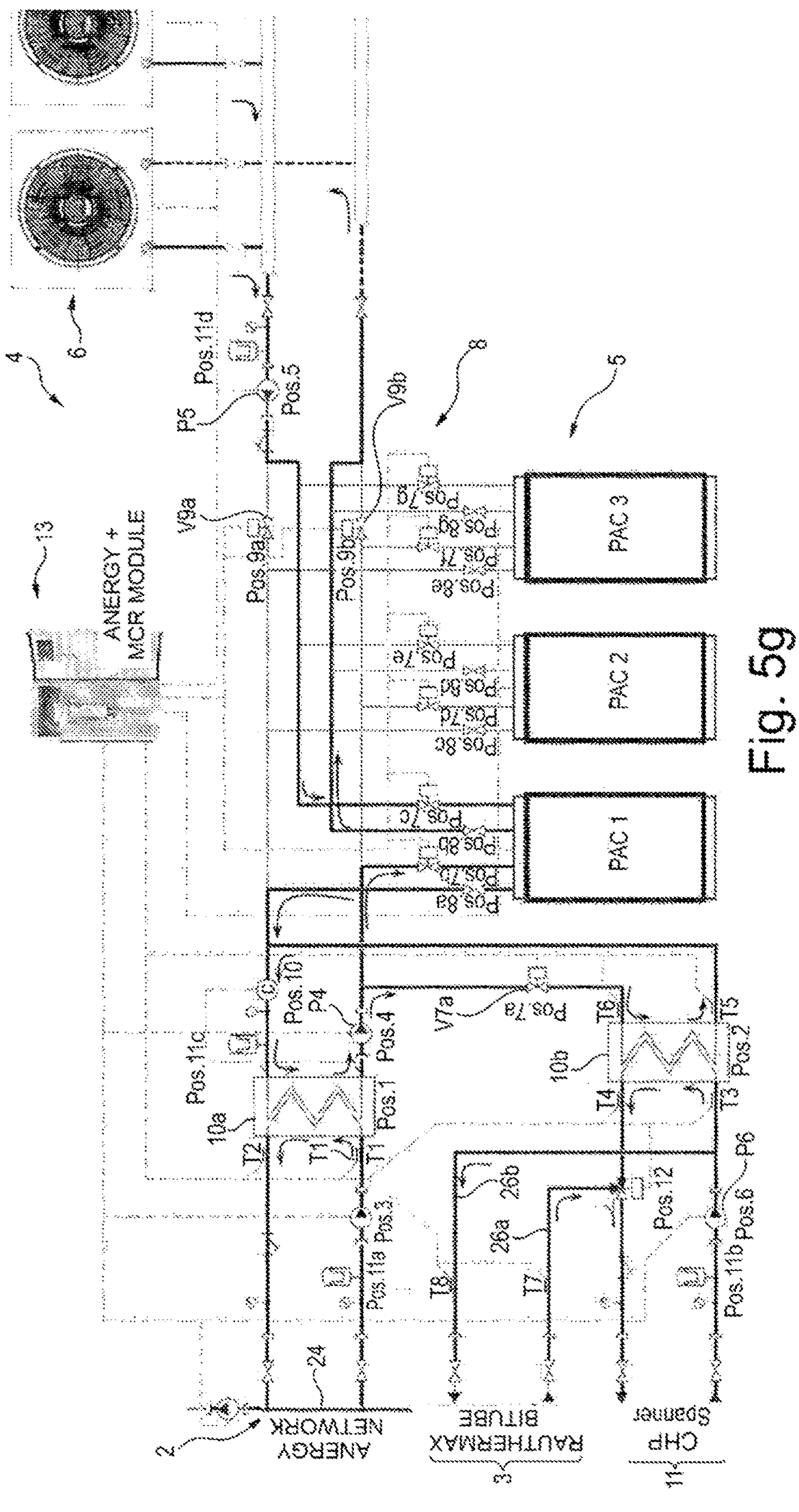

In the case where the CHP system is in operation, it is advantageous to use the heat of this system, as illustrated in FIG. 5*f*, because this heat is at a higher temperature than that of the anergy network with the consequence of increased speed of the defrost cycle.

If the CHP system 11 is located directly in a building that requires heating and domestic hot water, it is possible to divert part of the production with the valve V12 to supply an HT network 3, as shown in FIG. 5*f*, the HT network 3 being in this case connected to the distribution of heating water and domestic hot water of the building.

The dynamic and self-adaptive regulation of the MCR module 13 according to the outside air temperature allows to maximize the number of hours of operation of the auxiliary system 4 without the intervention of the heat pumps 5, or with a minimum of necessary heat pumps, which have a lower coefficient of performance than the use of air-water heat exchangers 6 with fans 7.

The MCR module 13, via the heat meter C10, can count the daily thermal production injected into the anergy network 2. The ratio of the variation in temperature of the heat transfer fluid and of the injected energy allows in a simple way to determine whether the heat pumps 5 and/or the CHP 11 system must be used, the purpose being to maximize the operation of the auxiliary system without the CHP system 11 and without or with a minimum of the heat pumps 5 during the period when the outside temperature is higher than the temperature of the heat transfer fluid of the anergy network 2 as illustrated in FIGS. 7*a* and 7*b*.

LIST OF REFERENCES

Thermal Energy Distribution System 1
- Low-temperature (Remote) thermal energy distribution network 2 (Anergy network)
  - monotube 24
- High-temperature thermal energy distribution network 3 (HT network)
  - tubes 26*a*, 26*b*
- Auxiliary system for Anergy network 4
  - Heat pumps (PAC) 5, 5*a*, 5*b*, . . . 5*n*
    - evaporator side circuit 28 inlet 28*a*
outlet 28*b*
condenser side circuit 30
inlet 30*a*
outlet 30*b*
Environmental air (external)-liquid (water) heat exchanger 6, 6*a*, 6*b* . . . 6*n* (Air-liquid exchanger)
Heat transfer fluid circuit 26
inlet 26*a*
outlet 26*b*
Fan 7
Hydraulic battery interconnection network 19
Hydraulic network 8
Valves V1, V2, V3, V4, V5, V6, Vn
mixing valves
shut-off valves
Pumps P1, P2, Pn
Expansion vessels E1, E2 . . . En
Measurement, Control and Regulation System (MCR system) 9
Control module (MCR module) 13
Sensors
temperature sensors T, T1, T2 . . . Tn
flow (flowrate) sensors
power meter C, C10
Communication module 21
Analyzer (Power Quality Analyzer) 15
Liquid-liquid heat exchangers 10
auxiliary system/anergy network heat exchanger 10*a*
auxiliary system/HT network heat exchanger 10*b*
auxiliary system/CHP network heat exchanger 10*c*
Cogeneration system (combined heat-power (CHP) system) 11
CHP network 11
CHP generator 12
premise (building) 17
User thermal installations (particularly buildings) 14
Heat pump 18
MCR system 20
Building heating/cooling network
Domestic hot water network (DHW network)
Electrical distribution network or cabinet 22
Communication network 16

The invention claimed is:

1. An auxiliary system for a low-temperature remote thermal energy distribution network (anergy network) connected to user thermal installations, the auxiliary system comprising a heat exchanger of the anergy network and one or more heat pumps thermally coupled to the anergy network via the heat exchanger, the auxiliary system further comprising one or more air-liquid heat exchangers thermally coupled to the outside air, and a hydraulic network interconnecting the heat pumps to the heat exchanger of the anergy network, at least one of the one or more heat pumps being a liquid-air heat pump fluidically connected by the hydraulic network to at least one of said air-liquid heat exchangers, an evaporator side of the liquid-air heat pump being fluidically connected to the at least one of said air-liquid heat exchangers configured for exchanging heat with the outside air, the auxiliary system further comprising a measurement, control and regulation (MCR) system, wherein the hydraulic network comprises valves controlled by the MCR system and a hydraulic circuit configured to allow direct connection of said air-liquid heat exchangers to the heat exchanger of the anergy network, wherein the MCR system comprises a plurality of temperature sensors, including at least one temperature sensor providing a temperature measurement of a heat transfer fluid in the anergy network and at least one temperature sensor providing a temperature measurement of the outside air, and an MCR module electronically connected to the plurality of temperature sensors and to the hydraulic network, the MCR module being configured to receive said temperature measurements and to control opening of said valves to allow said direct connection of the air-liquid heat exchangers to the heat exchanger of the anergy network.

2. The auxiliary system according to claim 1, wherein the system further comprises a system for the cogeneration of electrical and thermal energy (CHP system) thermally coupled to the hydraulic network via a heat exchanger of the CHP system.

3. The auxiliary system according to claim 2, wherein the hydraulic network further comprises another valve controlled by the MCR system and the hydraulic circuit is further configured to allow direct connection of the CHP system to the heat exchanger of the anergy network.

4. The auxiliary system according to claim 1, wherein the system further comprises a high-temperature thermal energy distribution network (HT network) thermally coupled to the hydraulic network via a heat exchanger of the HT network.

5. The auxiliary system according to claim 4, wherein the hydraulic network further comprises yet another valve controlled by the MCR system and the hydraulic circuit is further configured to allow direct connection of the HT network to the heat exchanger of the anergy network.

6. The auxiliary system according to claim 1, wherein it comprises a plurality of said heat pumps.

7. The auxiliary system according to claim 6, wherein the heat pumps are fluidically interconnected to the hydraulic network in parallel, each heat pump being connected to the hydraulic network through the valves controlled individually by the MCR system so as to allow the individual switching on of each heat pump independently of other heat pumps.

8. The auxiliary system according to claim 1, wherein the one or more air-liquid heat exchangers air-liquid heat exchangers comprise fans controlled by the MCR system.

9. The auxiliary system according to claim 1, wherein it comprises a plurality of said air-liquid heat exchangers.

10. The auxiliary system according to claim 9, wherein the air-liquid heat exchangers are fluidically interconnected to the hydraulic network in parallel.

* * * * *